(12) United States Patent
Sakoske et al.

(10) Patent No.: US 9,565,772 B2
(45) Date of Patent: Feb. 7, 2017

(54) METHOD OF FORMING CONDUCTIVE TRACE

(71) Applicant: Ferro Corporation, Mayfield Heights, OH (US)

(72) Inventors: George E. Sakoske, Independence, OH (US); Phil Maitland, Eccleshall (GB); Dietrich Speer, Langenselbold (GB); Frank Walter, Rüsselsheim (DE); Robert P. Blonski, North Royalton, OH (US); Srinivasan Sridharan, Strongsville, OH (US)

(73) Assignee: Ferro Corporation, Mayfield Heights, OH (US)

( * ) Notice: Subject to any disclaimer, the term of this patent is extended or adjusted under 35 U.S.C. 154(b) by 0 days.

(21) Appl. No.: 14/907,590

(22) PCT Filed: Jul. 22, 2014

(86) PCT No.: PCT/US2014/047512
§ 371 (c)(1),
(2) Date: Jan. 26, 2016

(87) PCT Pub. No.: WO2015/017171
PCT Pub. Date: Feb. 5, 2015

(65) Prior Publication Data
US 2016/0174386 A1    Jun. 16, 2016

Related U.S. Application Data

(60) Provisional application No. 61/859,323, filed on Jul. 29, 2013.

(51) Int. Cl.
*H05K 1/09* (2006.01)
*H05K 1/00* (2006.01)
(Continued)

(52) U.S. Cl.
CPC .......... *H05K 3/1291* (2013.01); *H05K 1/0296* (2013.01); *H05K 1/0306* (2013.01);
(Continued)

(58) Field of Classification Search
CPC ...... H05K 3/1291; H05K 1/092; H05K 3/388; H05K 2203/1126; H05K 1/0296; H05K 1/0306; H05K 1/115
(Continued)

(56) References Cited

U.S. PATENT DOCUMENTS 4,372,809 A * 2/1983 Grewal ................ H05K 3/244
204/192.12
4,871,108 A * 10/1989 Boecker ................ C04B 37/026
205/157
(Continued)

FOREIGN PATENT DOCUMENTS

RU    2338341 C2    11/2008

OTHER PUBLICATIONS

Espacenet bibliographic data for Russian Publication No. 2338341 published Nov. 10, 2008, two pages.
(Continued)

*Primary Examiner* — Sherman Ng
(74) *Attorney, Agent, or Firm* — Rankin, Hill & Clark LLP (57) ABSTRACT

The present subject matter provides for a multi-layer conductive trace. The trace can be formed by digital printing the individual layers and firing. The individual layers each impart functional characteristics to the conductive trace and each layer has components that can be adjusted to affect the performance characteristics of that particular layer without detrimentally affecting the performance characteristics of the remaining layers.

19 Claims, 3 Drawing Sheets

(51) Int. Cl.
  *H05K 3/10* (2006.01)
  *H05K 3/12* (2006.01)
  *H05K 1/02* (2006.01)
  *H05K 1/03* (2006.01)
  *H05K 1/11* (2006.01)
  *H05K 3/38* (2006.01)

(52) U.S. Cl.
  CPC ............ *H05K 1/115* (2013.01); *H05K 1/092* (2013.01); *H05K 3/388* (2013.01); *H05K 2203/1126* (2013.01)

(58) Field of Classification Search
  USPC .................................. 174/257, 258; 29/846
  See application file for complete search history.

(56) References Cited

U.S. PATENT DOCUMENTS

| | | | |
|---|---|---|---|
| 6,200,897 B1 | 3/2001 | Wang et al. | |
| 6,824,857 B2 | 11/2004 | Lochun et al. | |
| 7,564,658 B2 | 7/2009 | Zhang et al. | |
| 2013/0186675 A1* | 7/2013 | Takahashi | H05K 1/0306 174/253 |
| 2013/0256014 A1* | 10/2013 | Takahashi | H05K 1/092 174/257 |

OTHER PUBLICATIONS

International Search Report for corresponding PCT/US2014/047512 mailed Nov. 20, 2014, one page.

* cited by examiner

METHOD OF FORMING CONDUCTIVE TRACE

FIELD

The present subject matter relates to conductive traces and to methods of forming conductive traces.

BACKGROUND

Conductive traces are well known in the art and are typically produced with very small, thin copper pathways as the conductive material. One problem associated with copper traces is that copper is subject to corrosion from various sources. Copper forms compounds with oxidation states +1 (cuprous) and +2 (cupric). Although copper does not react with water, it does react with atmospheric oxygen forming a layer of brown-black copper oxide. Oxidation of the surface of the copper forms a green layer of verdigris (copper carbonate) that protects the bulk of the copper from further corrosion. However, in conductive traces, where the copper is formed from a layer having very thin width and thickness, "surface" corrosion can potentially break the conductive pathway or degrade performance of the conductive trace. Copper also reacts with sulfides, such as hydrogen sulfide, to form various copper sulfides on the surface of the copper. In reacting with sulfides, the copper corrodes, as is seen when copper is exposed to air containing sulfur compounds. Oxygen-containing ammonia solutions also react with copper to produce water-soluble complexes, as do oxygen and hydrochloric acid to form copper chlorides and acidified hydrogen peroxide to form copper (II) salts. Copper (II) chloride and copper react to form copper (I) chloride. Therefore there is a need to protect the copper traces from corrosion.

Conductive traces are typically formed by either subtractive or additive processes. Generally, in a subtractive process, copper is coated on a substrate and unwanted portions are removed to leave thin traces of copper. One problem with conventional subtractive processes is that they produce unwanted waste. Subtractive production techniques often begin with copper applied to one or both sides of a substrate. The trace is formed by etching away the unwanted copper from the substrate, leaving behind thin conductive copper traces on the substrate. The etching process typically utilizes ammonium persulfate or ferric chloride. The chemicals and removed unwanted copper is corrosive and toxic and produces environmental concerns and excess waste. Additionally, etching times are comparatively long. Further, as the etchant is repetitively used, copper saturates the chemical etchant making it progressively less effective in subsequently removing copper.

Generally, in an additive process to form traces, copper is formed on a substrate only in areas that form a trace. One problem associated with forming conductive traces by conventional additive processes is that the processes require multiple steps involving various equipment and machines. In a typical additive process, a substrate is imaged with a photosensitive film to produce an exposed pattern. The exposed pattern is subjected to a chemical bath to make the pattern capable of bonding with metal ions. The sensitized areas are then plated with copper to form the traces. The mask is then stripped from the substrate leaving only the copper traces.

Problems associated with both additive and subtractive conventional production techniques is that the copper traces, once formed, need to be protected against corrosion and shorting of the traces due to condensation. The traces are treated with a protective coating after being formed to protect against corrosion. This procedure requires an additional step that involves additional time, money, and equipment. Another problem with conventional production techniques is that the copper traces formed on a substrate exhibit only one color. That is, if the trace is applied to glass or a transparent plastic, the copper color of the trace is visually apparent from one or both sides of the substrate. Another problem associated with conventional techniques is that the substrates must be treated in order for the copper to appropriately bond to the surface. This again requires an additional step necessitating an investment of time and money.

One further weakness in conventional plating techniques is that the thin copper traces are subject to wear and abrasion and the conductive path is easily broken. When abraded to a point where conductivity is broken, the conductive trace becomes inoperable for its intended use.

SUMMARY

The difficulties and drawbacks associated with previously known conductive traces and production strategies are overcome in the present conductive traces and methods of forming conductive traces.

The present subject matter relates to layered conductive traces formed on various substrates.

In one aspect, the present subject matter provides a conductive trace comprising an interface layer bonded to a substrate and a conductive layer on the interface layer.

In another aspect, the present subject matter provides a conductive trace comprising an interface layer bonded to a substrate, a conductive layer on the interface layer, a redox control layer covering an exposed portion of the conductive layer, a precious metal layer on the redox control layer, and a dielectric layer on the redox control layer.

In still another aspect, the present subject matter provides a method of forming a conductive trace on a substrate comprising bonding an interface layer to a surface of a substrate, forming a conductive layer on the interface layer, layering a redox control material on the conductive layer, wherein the redox control layer covers an exposed portion of the conductive layer.

The present subject matter allows for tailoring of specific layers of a multi-layer conductive trace to alter the properties and characteristics of the trace, without detrimentally affecting the performance of the trace and to address particular needs for a particular use, manufacturing process, and situation.

As will be realized, the subject matter described herein is capable of other and different embodiments and its several details are capable of modifications in various respects, all without departing from the claimed subject matter. For example, each layer may involve a gradual change in composition or effective solids loading within various portions of the layer. This is referred to as a gradient layer and will be discussed in more detail herein. Accordingly, the drawings and description are to be regarded as illustrative and not restrictive.

BRIEF DESCRIPTION OF THE DRAWINGS

These, as well as other features, aspects, and advantages of the present subject matter, will be more completely understood and appreciated by referring to the following

DETAILED DESCRIPTION OF THE EMBODIMENTS

The subject matter described herein provides conductive traces and method of forming the conductive traces on substrates. Depending on the purpose of the associated substrate, the conductive trace may function as a signal, power, or ground in an electrical circuit. Likewise, the conductive trace can fan-in, fan-out or both. The conductive traces can be utilized in a number of electronic products to transmit electrical impulses, while at the same time being more durable and more easily produced than with existing technology. The conductive traces of the present subject matter comprise a multi-layered configuration that is relatively inexpensive and simple to produce, are durable, and exhibit good electrical conductivity.

The traces can be applied to a variety of substrates and thus are able to be incorporated into various electrical circuitry. The traces are multi-layered, wherein each layer is included for a specific benefit and imparts special characteristics to the trace not available in single-layered traces. Because typical conductive traces are single-layered, any adjustment to the composition to affect a particular performance characteristic necessarily influences the entire trace and properties thereof. In some circumstances, the adjustment to affect one performance characteristic may also detrimentally affect other performance characteristics of the known single-layered conductive traces. In contrast, the present subject matter provides a plurality of separate layers, built up to form a multi-layered conductive trace. The separate layers can be individually altered to affect a particular performance characteristic without necessarily changing the performance of the other layers. The conductive traces are adaptable to various intended uses and needs, and provide an economical alternative to traditional production techniques.

Substrates

The conductive traces of the present subject matter can be applied to glass, ceramic, metal, and polymer substrates, and combinations thereof, among others. The type of substrate chosen will partially determine the composition and assembly of layers of the conductive trace as discussed herein.

Typical uses for the conductive traces as applied to glass substrates include automotive, architectural, appliance, container, light emitting diodes (LED), and display/decoration applications. Typical uses for the for the conductive traces as applied to ceramic substrates include Electronic Packaging Materials such as: Hybrid Integrated Circuit (HIC) Thick Film Materials used in telecommunications, solar, automotive, medical, consumer, and military applications, Low Temperature Co-fired Ceramic (LTCC) Systems for modules used in medical electronics, consumer A/V, computers, wireless handsets, automotive subassemblies, data/telecom infrastructure equipment, and defense/aerospace, High Frequency Ceramic Inductors, Front End Modules, Bluetooth Modules, Antenna Switching Modules, and Common Mode Filters, MEMS, Sensors, LED, and other electronic devices. Typical uses for the conductive traces as applied to metal substrates include appliance and LED applications. Typical uses for the conductive traces as applied to polymer substrates include computer circuit board applications.

Conductive Traces

Figure 1:
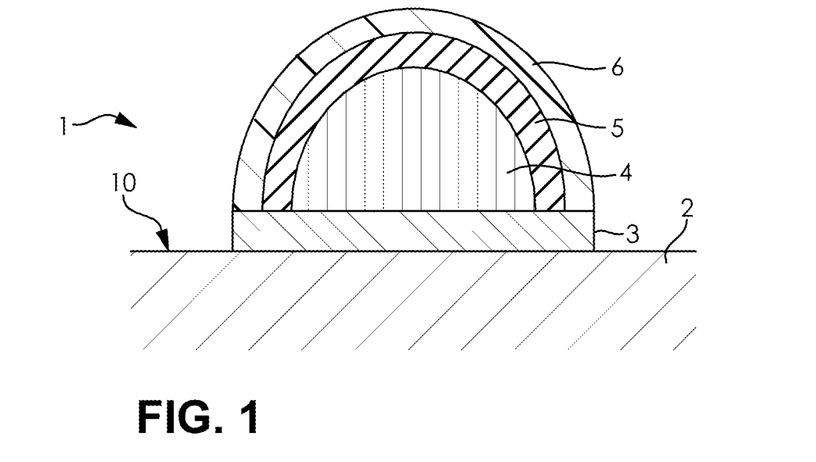
FIG. 1 is a schematic cross-sectional view of a conductive trace in accordance with the present subject matter before firing on a substrate.
Figure 2:
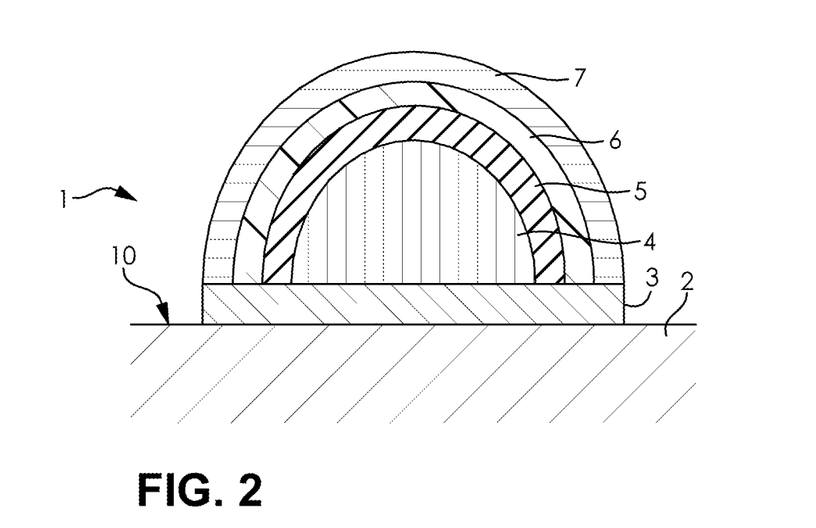
FIG. 2 is a schematic cross-sectional view of another conductive trace in accordance with the present subject matter before firing on a substrate.
Figure 3:
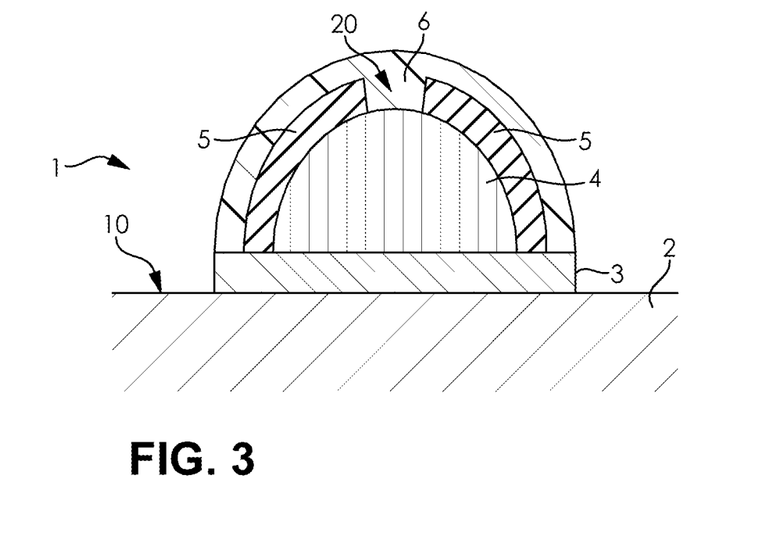
FIG. 3 is a schematic cross-sectional view of another conductive trace in accordance with the present subject matter before firing on a substrate.
Figure 5:
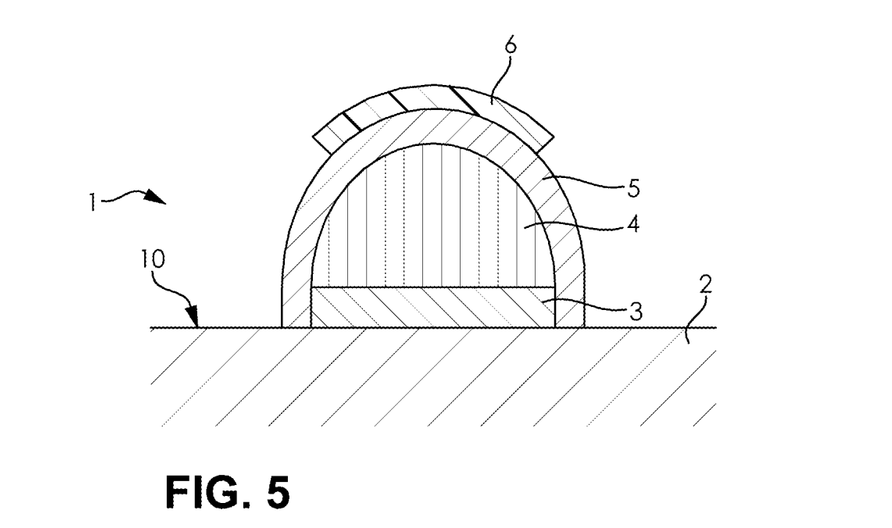
FIG. 5 is a schematic cross-sectional view of another conductive trace in accordance with the present subject matter before firing on a substrate.
Figure 6:
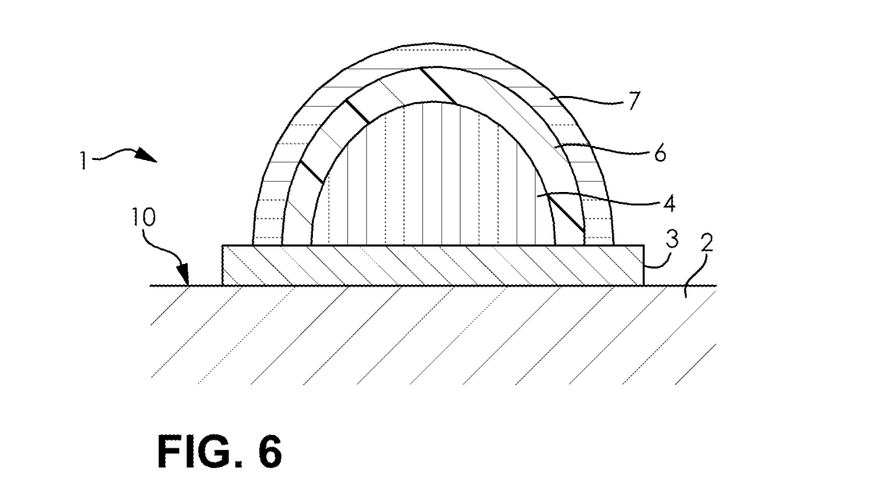
FIG. 6 is a schematic cross-sectional view of a conductive trace in accordance with the present subject matter formed on a substrate.

The conductive traces of the present subject matter are multiple layer traces adapted to transmit electrical impulses for various uses. Several embodiments are depicted in the associated figures wherein like numbered objects indicate similar features on each embodiment. In reference to FIG. 1-5, a conductive trace 1 is depicted before a firing operation. The trace 1 is deposited on a surface 10 of a substrate 2. Before firing, the trace 1 comprises an interface layer 3, a conductive layer 4, a redox control layer 5, and a precious metal layer 6. Although depicted in FIGS. 1-5, it will be understood that the redox control layer 5 acts as a sacrificial layer. That is, the redox control layer may be used to protect the conductive layer 4 from oxidation during firing, and thus may be completely removed, or substantially so, during a firing procedure. In another embodiment as shown in FIG. 2, the conductive trace 1 can also comprise a dielectric/anti-scratch layer 7 on the precious metal layer 6. In still another embodiment as shown in FIG. 3, the precious metal layer 6 can contact the conductive layer 4, through one or more apertures or voids 20 in the redox control layer 5. These apertures or voids 20 can be formed in the initial printing of the redox control layer or can be formed as a result of the firing process, where the redox control layer is substantially or completely burned away during firing as a sacrificial layer. This aspect is shown in FIG. 6, showing a conductive trace 1, after a firing process, bonded to the surface 10 of a substrate 2. In FIG. 6, no redox control layer is depicted as it has been substantially completely burned away during firing. Instead, the interface layer 3 is bonded to the surface 10 of a substrate 2. The conductive layer 4 is on the interface layer. Because the redox control layer has been substantially removed during firing, the conductive layer is in contact with the precious metal layer 6, which has a dielectric/anti-scratch layer 7 thereon.

Figure 4:
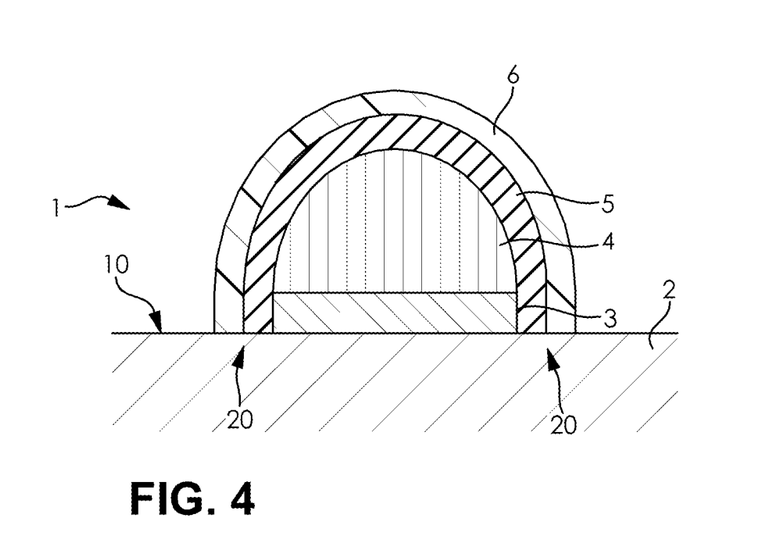
FIG. 4 is a schematic cross-sectional view of another conductive trace in accordance with the present subject matter before firing on a substrate.

Although specific layers of the conductive trace are shown in the FIGS. 1-4 to completely cover an underlying layer, such is not required by the present subject matter and the embodiments are not so limited. This aspect is depicted in FIG. 5, where the precious metal layer 6 only partially covers the underlying redox control layer 5. Also, the conductive traces of the present subject matter are not limited to the composition or arrangement of layers as depicted and described herein and can incorporate additional or fewer layers or can be differently arranged as desired.

Generally, the conductive trace of the present subject matter before firing comprises an interface layer from 0 to about 10% by volume, a conductive layer from about 40 to about 90% by volume, a redox control layer from 0 to about 20% by volume, a precious metal layer from 0 to about 15% by volume, and a dielectric layer from 0 to about 15% by volume. Other optional layers, not limited to those described herein, can also be incorporated into the conductive traces as desired.

Interface Layer

The interface layer is the bottom most layer of the multi-layer conductive trace. The interface layer is formed on a surface of a substrate and lies between the substrate and the other layers of the conductive trace. More specifically, the interface layer lies between the conductive layer and the substrate. Other layers incorporated into the conductive trace, i.e. the redox control layer, the precious metal layer, the dielectric layer, etc., are not necessarily separated from the substrate by the interface layer. This is shown in FIG. 4 where only the conductive layer 4 is separated from the substrate 2 by the interface layer 3. The redox control layer 5 and the precious metal layer 6 come into contact with the substrate 2 at locations 20.

The interface layer provides improved adhesion to the substrate as the interface layer can be tailored to strongly bond with specific substrate material, while at the same time not affecting the overall performance of the trace. This is so because the interface layer is not responsible for conducting electrical impulses and thus tailoring its composition, will not affect its conductivity.

The composition of the interface layer affects the adhesion and largely depends on the composition of the substrate to which the conductive trace is bonded. Generally, in the case of ceramic and glass substrates, the interface layers contains materials similar to the ceramic or glass substrate to promote proper boding, but also can contains additives such as metal powders or other expansion modifies to help reduce the potential thermal expansion differences between the substrate and the conductive trace as a whole and the conductive layer in particular. Expansion modifiers are materials that have a thermal expansion coefficient between that of the conductive layer and that of the substrate. When the interface layer can bridge the gap between the expansion coefficients of the conductive layer and substrate, a better and stronger bond is provided for the conductive trace that is resilient to temperature changes in the surrounding environment. Typically, the expansion modifier will be a metal but is not limited to such. Examples of suitable expansion modifiers include quartz, zirconia, spinels and mixtures thereof. Other examples include zinc silicates, magnesium silicates, barium silicates, strontium silicates, barium or strontium aluminum silicates, lithium alumina silicates, zirconium silicates, barium magnesium silicates, barium titanium silicates, cordierite, zirconia, alumina, silica, titania and mixtures of the foregoing. Typical expansion modifiers can also include $SiO_2$, $Al_2O_3$, $CaZrO_3$, $CaSiO_3$, $Mg_2SiO_4$, $CaTiO_3$, $BaZrO_3$ and $SrZrO_3$, $SiO_2$, $Mg_2SiO_4$ and $CaSiO_3$. In one embodiment, the expansion modifiers comprise cordierite, Beta Eucryptite, zirconia, and combinations thereof.

Specifically, in the case of ceramic and glass substrates, the interface layer comprises borosilicate glass frits, zirconia, alumina, cordierite, mixed metal oxide pigments, metal powders such as copper, aluminum, silver, and tin. In the case of silicon solar cells, the interface layer comprises a glass frit including oxides of at least one metal selected from the group consisting of silicon, lead, bismuth, aluminum, zinc, titanium, tantalum, phosphorous, alkali metals and alkaline earth metals. In the case of metal substrates, the interface layer contains borosilicate glass frits, zirconia, alumina, and other dielectric materials to provide an electrically insulating interface layer. In the case of polymer substrates, the interface layer contains silane based adhesion promoters.

In an additional aspect, the interface layer further composes material that is able to control unwanted interactions between the substrate and the conductive trace. For example, when a conductive trace is applied to a glass substrate, the interface layer comprises material to reduce ion exchange between the glass and the conductive trace. Ion exchange occurs where an alkali such as Na+ in the glass exchanges for a larger K+ or small Li+ ion in the conductive trace and creates surface stresses of tension or compression in the glass substrate exhibiting a structural weakening in that region of the substrate. With the interface layer controlling ion exchange, such stresses do not form at the substrate-trace interface. A stronger substrate and a more durable bond with the conductive trace results. In this aspect, alkali ions such as sodium and potassium may be included in the interface layer to control ion exchange.

In one embodiment, the interface layer also contains materials to help prevent migration of silver, copper, or other metal ions from the conductive layer into the bulk of the substrate or across the surface of the substrate. In particular for glass substrates, a migration control additive such as silicon, iron, or zinc metals, and also sulfur containing glass frits are used for this purpose. Other additives for this or another substrate can include palladium, copper, gold, tin, carbon, polymers, and low dielectric materials. In one aspect, in the case of automotive and black obscuration bands, silver or copper ion migration through the black ceramic enamel is very undesirable and difficult to stop. Therefore, the conductive trace interface layer is deposited onto an unfired glass ceramic enamel, where the glass ceramic enamel is printed on the glass.

In another embodiment, the interface layer includes a pigment. In the case where the traces will be observable through a transparent substrate, inorganic pigments such as CuCr, CuCrMn, FeCrCo, $TiO_2$, and the like, are added to the interface layer. These pigments impart a color tone to the conductive trace as seen through a transparent or semi-transparent substrate. Rather than viewing bare conventional copper traces through the substrate, the addition of pigments influence the see-through color of the trace making them more aesthetically appealing. Other suitable pigments are NiCrFe, FeCo, FeMn and combinations thereof with or without modifiers. Other coloring agents can be used including organic pigments and dyes. Suitable modifiers used to intensify the color for such inorganic pigments include, for example, any one or a combination of the following elements: chromium, lithium, magnesium, silicon, strontium, tin, titanium and zinc. Other modifiers can be included to affect dispersability, heat stability, lightfastedness, weatherability, opaqueness, and to avoid pigment migration from the layer.

In one embodiment for metal or other electrically conductive substrates, a dielectric material is included as, or with other materials to form, the interface layer. Dielectric materials are electrical insulators that can be polarized by an applied electric field. Electric charges do not flow through the material but only slightly shift the molecules causing dielectric polarization. Solid dielectric material is well known in the art and includes porcelain, glass, and most polymers. Liquid and gaseous dielectric material is also known. The dielectric material prevents electrical contact or shorting of the trace that can occur between the conductive layer and a conductive substrate. In one aspect, the dielectric material is applied as the interface layer. In another aspect, the dielectric layer is applied with other materials to form the interface layer. In this aspect, the dielectric material can be used in the entire interface layer or only in select areas of the interface layer as desired for a particular purpose to allow an electrical contact at select locations between the trace and the conductive substrate. Typical dielectric materials are formed with borosilicate glass frits, silica, zirconia, alumina, and titania based compounds e.g. Barium titanate.

The interface layer provides adjustable interaction with the substrate and is advantageous in that its composition can be altered for specific purposes without degrading the electrical conductivity of the conductive trace as a whole.

Conductive Layer

The conductive layer of the present subject matter provides a low cost base metal core of the multi-layered conductive trace that is capable of conducting electrical impulses. The conductive layer is positioned over the interface layer, wherein the interface layer lies between the substrate and the conductive layer.

In one embodiment, the conductive layer comprises conductive metal and/or metal powder. Suitable metal and metal powders are copper, aluminum, nickel, tin, tungsten, zinc, iron, silver, various steels, and the like, either singly or in combination. These metals are good conductors and relatively inexpensive, but they may be subject to corrosion from environmental exposure. The multi-layered conductive trace of the present subject matter provides protection from corrosion for these low cost metals. Various other layers of the conductive trace are provided to protect the conductive layer from oxidizing or otherwise being degraded by environmental exposure. This protection allows for the use of low cost conductive metals for this layer rather than the use of high cost precious metals, such as silver that are not subject to corrosion.

In one aspect, the conductive layer also includes a sintering aid comprising glass frit. The sintering aid assists in forming the various metal powders into a continuous conductive pathway exhibiting low electrical resistance. The sintering aids allows the metal powders to bond during the sintering process and decreases the likelihood of voids, gaps, or other inconsistencies in the conductive pathway of the metal that would negatively affect conductive properties of the conductive trace.

While the conductive layer comprises low cost metal powders as previously mentioned, in one aspect it is also contemplated that one or more precious metals are incorporated into the conductive layer, either exclusively or in combination with the low cost metal powders. The conductive layer can also be applied digitally in a composition gradient so as to minimize differences in thermal expansion between the substrate and the most proximate portion of the conductive layer. In this embodiment, the gradient (i.e. increase in concentration) of the metal powder within the conductive layer is adjusted by varying the concentration of the metal powder vertically through the layer. That is, a portion of the conductive layer closest to the interface layer has a different ratio of metal powder than a portion of the conductive layer furthest from the interface layer, with the ratio being continuously increased or decreased between the two portions. If the proportion of metal powder in the conductive layer is higher in a portion near the substrate, then the gradient points towards the substrate. If the proportion of metal powder in the conductive layer is higher in a portion furthest from the substrate, then the gradient points away from the substrate. Similarly, the metal powder concentration can be varied horizontally through the conductive layer. A combination of varying the amount of metal powder horizontally and vertically is also contemplated.

Reduction-Oxidation Control Layer

In one embodiment, a reduction-oxidation (hereinafter "redox") control layer in incorporated into the multi-layer conductive trace of the present subject matter. The inclusion of this layer in the conductive trace is dependent on material used in the remaining top coat layers. The redox control layer provides oxidation protection for the conductive layer. The redox control layer is therefore layered above the conductive layer. The interface layer and the redox control layer encapsulate the conductive layer before firing. That is, after the conductive layer is deposited on the interface layer, the redox control layer covers the exposed portions of the conductive layer. In another embodiment, the redox control layer, or a separate second redox control layer, may be deposited on top of the precious metal layer (discussed subsequently herein) which is on top of the conductive layer, so that the redox control layer, or the second redox control layer as the case may be, is present as a layer toward the outside of the precious metal layer and can act to inhibit oxygen diffusion into the conductive trace during the firing and sintering process.

In one aspect, redox control layer includes carbon particles, oxygen getter materials, or combinations thereof. The carbon particles can comprise carbon nano-particles ranging in average diameter from 10 to 50 nanometers. By "oxygen getter" it is meant a composition or material that reacts and consumes oxygen, or absorbs oxygen—thus making any free oxygen within the conductive trace substantially unavailable to react with and corrode the conductive layer. Optionally included within the redox control layer is silicon, titanium, nitrides, carbides, high molecular weight polymers or combinations thereof as oxygen getters for the conductive trace.

In one aspect, the redox control layer will be sacrificially oxidized during the firing process. In this aspect, the redox control layer may be completely removed from the conductive trace, or substantially so, thus producing a conductive connection between the conductive layer and the precious metal layer. In another aspect, the redox control layer will not entirely burn off, for example in the case where oxygen getters are used, in which case the getters themselves may form oxide compounds that remain after firing. In the figures, although depicted, it will be understood that the redox control layer may or may not be present after firing. The depiction in the figures of the redox control layer is included for convenience and understanding and not to restrict the present subject matter to having a redox control layer in the final, fired trace. The redox control layer can also comprise a barrier material to prevent the migration of oxygen to the conductive layer from the surrounding environment. In this aspect, the redox control layer may not be substantially removed during the firing process but remains to provide a barrier to oxygen. The carbon particles, barrier material, and oxygen getter material can each be used individually or in combination for the redox control layer.

Precious Metal Layer

In one embodiment, the conductive trace includes a precious metal layer. The precious metal layer offers an additional protection against oxidation for the conductive layer. The precious metal layer is also included for improve soldering adhesion of tabs or other electrical connections, and for protection against oxidation of the conductive layer during operation at high temperatures.

The inclusion of the precious metal layer is dependent on the firing cycle for the layers of the conductive trace and on the effectiveness of the redox control layer. As the duration and temperature of the firing cycle to form the conductive trace increases, the likelihood for oxidation of the conductive layer also increases. Likewise, where the formed conductive trace will be used in high-temperature and oxygen-containing environments, it is more likely that the conductive layer will oxidize. To address these concerns, a precious metal layer is included to minimize the potential for oxidation of the conductive layer. Similarly, if a solder contact is needed for the trace, a precious metal layer is included because typically, precious metals such as silver, form stronger solder connections than the solder connection formed with low cost metals used in the conductive layer.

In one embodiment, the precious metal layer is incorporated over the redox control layer before firing. Typically, the precious metal layer completely covers the redox control layer, or substantially so. In another aspect, the precious metal layer covers only a portion of the redox control layer. Alternatively, the precious metal layer may be introduced as part of the redox control layer by providing precious metal particles/material in the material used for the redox control layer, or vise versa, essentially combining the processing and final functionality of the two layers. Upon firing of the material used for the two layers and sintering of the metal particles therein, the redox control material should be sacrificially oxidized and be substantially removed so as to allow for good electrical contact between the conductive layer and the sintered precious metal material. In these embodiments, the sintered precious metal material physically connects with the conductive layer through voids in the redox control layer either intentionally printed in the redox control material so it is not a continuous layer, or subsequently formed in the redox control material during firing. This connection can provide electrical communication between the precious metal layer and the conductive layer. The precious metal layer can then be used to in concert with the conductive layer to conduct electrical impulses.

In another embodiment, the conductive layer and the precious metal layer can be electrically isolated from each other. For example, dielectric materials can be introduced into the redox control layer between the conductive and the precious metal layers. In this example the precious metal layer and the conductive layer can transmit separate electrical impulses at the same time on the same conductive trace in the same or opposite directions.

The precious metal layer is comprised of particles of silver, gold, platinum, titanium, rhodium, palladium, osmium, iridium, rhenium, ruthenium, germanium, beryllium, gallium, indium, tellurium, mercury, bismuth, or combinations and alloys thereof. Additionally, the precious metal layer can further comprise particles of any metal or alloy that does not readily corrode and/or is capable of forming strong solder connections.

Dielectric Layer

In one embodiment, a dielectric layer, separate and distinct from the dielectric material used in the interface layer for metal substrates, is incorporated into the multi-layer conductive trace of the present subject matter. This additional layer can further include inorganic pigments, in a similar way as the interface layer, in order to provide a visually appealing aesthetic appearance to the conductive traces when they are visible to a user. The dielectric nature of this layer provides electrical insulation for the trace, preventing shorting of a circuit in which the trace is incorporated. This layer can also provide a hard-coat finish for the trace in order to inhibit abrasion and scuffing from deteriorating the performance of the conductive trace or breaking the conductive pathway.

In one aspect, the dielectric layer is incorporated into the conductive trace over the precious metal layer. In another aspect, the dielectric layer completely covers the precious metal layer, or substantially so. In still another aspect, the dielectric layer covers only portions of the precious metal layer.

In one embodiment, the dielectric/anti-scratch layer is comprised of porcelain, glass, polymers, or combinations thereof. In one aspect, the dielectric layer further comprises particles of aluminates, zirconates, silicates, clays, talc, refractory oxide material, refractory nitride material, refractory boride material, and combinations thereof. These particulate components are combined with glass frit material to be sintered on to the precious metal layer.

In one exemplary aspect, the dielectric layer further comprises a pigment. The pigment is selected from the group consisting of CuCr, CuCrMn, FeCrCo, $TiO_2$ NiCrFe, FeCo, FeMn and combinations thereof, with or without modifiers. Other coloring agents can be used including organic pigments and dyes. Modifiers can be included to affect pigment color intensity, dispersability, heat stability, lightfastedness, weatherability, opaqueness, and to avoid migration of pigment from the layer. The inclusion of a pigment in this layer will provide an aesthetic appearance for the conductive trace where the conductive trace is visible from the surface of the substrate.

Other Optional Layers

The multi-layered conductive trace of the present subject matter is not limited to the layers mentioned previously herein or to the order in which the layers are depicted, but can include other optional layers or multiple layers of those mentioned herein and/or layered in differing arrangements so as to improve the functionality of the conductive trace. Other optional layers for the multi-layer conductive trace can include heat reflective layers, thermal conductivity layers, emissivity control layers, infrared reflective layers, color correction layers, an the like.

Methods

The present subject matter relates to methods of forming the conductive traces that have been previously described herein. In one embodiment, the method includes bonding an interface layer to the surface of a substrate. When bonding to a glass or ceramic substrate, the interface layer is formed from an interface material, generally comprising glass frit, ceramic and metal powders. As discussed previously and incorporated herein, the interface material can further comprise an expansion modifier, a silver migration control additive, and inorganic pigment, and a dielectric material, among others. In one aspect, the interface material is digitally printed on the surface of the substrate, and in this aspect the interface material further comprises a solvent and a binder. After digitally printing the interface material onto the surface of the substrate, the interface material is fired to burn off the solvent and binder, to sinter the remaining components of the interface material, and to form the interface layer and bond it to the substrate.

The method further includes forming a conductive layer on the interface layer. The conductive layer is formed from a conductive material comprising a conductive metal powder selected from the group consisting of copper, aluminum, nickel, tin, tungsten, zinc, iron, silver, steel, and combinations thereof. In one aspect the conductive material can further comprise a sintering aid. In another aspect the conductive material is digitally printed on the interface material, and in this aspect the conductive material further comprises a solvent and a binder. After digitally printing the conductive material onto the interface material, the conductive material is fired to burn off the solvent and binder, to sinter the metal powder therein, and to form the conductive layer on the interface layer.

The method further includes layering a redox control layer on the conductive layer. The redox control layer is formed from a redox control material comprising a redox control agent selected from the group consisting of carbon particles, oxygen getter material, and combinations thereof. In one aspect, the carbon particles have an average diameter from 10 to 50 nanometers. In one embodiment, the oxygen getter materials are selected from the group consisting of silicon, titanium, nitrides, carbides, high molecular weight polymers, and combinations thereof. In one aspect, the redox control material is digitally printed on the conductive material so as to encapsulate and protect the conductive material from oxidation. In this digital printing method the redox control material further comprises a solvent and a binder. After digitally printing the redox control material onto the conductive material, the redox control material is fired to burn off substantially all the component material, i.e. solvent, binder, and sacrificial oxidizing material. In this aspect, the redox control material is substantially removed from the conductive layer. In another aspect, where the redox control material includes oxygen barrier material, the redox control material will not substantially be removed during firing, but will remain as a barrier to oxygen after firing, and/or as a dielectric layer.

The method further includes producing a precious metal layer over the conductive layer. The precious metal layer is formed from a precious metal material comprising a precious metal selected from the group consisting of silver, gold, platinum, titanium, rhodium, palladium, osmium, iridium, rhenium, ruthenium, germanium, beryllium, gallium, indium, tellurium, mercury, bismuth, and combinations thereof. In one embodiment, the precious metal is in powder form. In one aspect, the precious metal material is digitally printed on the redox control material or incorporated as part of the redox control material. In this digital printing method the precious metal material further comprises a solvent and a binder. After digitally printing the precious metal material onto or with the redox control material, the precious metal material is fired to burn off the solvent and binder, to sinter the precious metal powder, and to form the precious metal layer over the conductive layer. In one aspect, the precious metal layer contacts the conductive layer through apertures or voids in the printed redox control material. These voids are formed either intentionally by printing, wherein the redox control material acts as a barrier layer after firing; or as a product of firing, wherein the redox control material is substantially burned away.

The method further includes generating a dielectric layer on the precious metal layer. The dielectric layer is formed from a dielectric material comprising a dielectric agent selected from the group consisting of porcelain, glass, polymers, and combinations thereof. The dielectric material can further comprise particles selected from the group consisting of aluminates, zirconates, silicates, clays, talc, refractory oxide material, refractory nitride material, refractory boride material, and combinations thereof. The dielectric material can further comprise a pigment selected from the group consisting of CuCr, CuCrMn, FeCrCo, $TiO_2$, NiCrFe, FeCo, FeMn and combinations thereof, with or without modifiers. Other coloring agents can be used including organic pigments and dyes. Modifiers can be included to affect pigment color intensity, dispersability, heat stability, lightfastedness, weatherability, opaqueness, and to avoid migration of pigment from the layer. In one aspect, the dielectric material is digitally printed on the precious metal material. In this digital printing method the dielectric material further comprises a solvent and a binder. After digitally printing the dielectric material onto the precious metal material, the dielectric material is fired to burn off the solvent and binder, to sinter the remaining components of the dielectric material, and to form the dielectric layer on the precious metal layer.

In one embodiment, the firing of the material for each layer of the conductive trace is performed in one single firing step after all the material for all the layers has been printed/deposited. Alternatively, separate firing steps can be used in a print/fire/print/fire . . . etc. method where each layer is formed individually. In this alternating method, the material for each layer would be deposited on the underlying fired layer, rather than on the underlying pre-fired material. While digital printing is used to deposit the various materials, it is also contemplated that other techniques known in the art can be used to deposit the materials and form the individual layers of the conductive trace.

When each layer is applied by digital printing, the foregoing solid ingredients for each layer may be combined with an organic vehicle to form a paste. In one embodiment, the paste for each layer in general contains about 30-80 wt. % solids, and about 20-70 wt. % of an organic vehicle. The viscosity of the pastes is adjusted for the particular layer to be formed and solids to be included, so that the paste for each layer can be digitally printed in a desired manner and thickness onto the desired substrate.

The organic vehicle for the pastes comprises a binder and a solvent, which are selected based on the viscosity needed for the digital application technique, the material composition of the substrate to be printed, the composition and physical characteristics of the solids portion of the paste, and the desired thickness of the layers to be printed. The vehicle suspends the particulates (i.e., solids portion of metal powder, pigment, frit, oxygen getter materials, polymers, clays, etc.) during printing and completely burns off, or substantially so, upon firing. In particular, binders including methyl cellulose, ethyl cellulose, and hydroxypropyl cellulose, and combinations thereof, may be used. Suitable solvents include propylene glycol, diethylene glycol butyl ether; 2,2,4-trimethyl pentanediol monoisobutyrate (Texanol™); alpha-terpineol; beta-terpineol; gamma terpineol; tridecyl alcohol; diethylene glycol ethyl ether (Carbitol™), diethylene glycol butyl ether (Butyl Carbitol™); pine oils, vegetable oils, mineral oils, low molecular weight petroleum fractions, tridecyl alcohols, water, and synthetic or natural resins and blends thereof. Surfactants and/or other film forming modifiers can also be included. The solvent and binder may be present in a weight ratio of about 50:1 to about 20:1.

In each ink, the solids portion can be continuously varied during printing to form gradient layers having a continuously adjusted sintered material content between different portions of the individual layers. In general, the viscosity of the pastes for purposes of digital printing range from 1.0 to 2,000 centipoise at 20° C.

Many other benefits will no doubt become apparent from future application and development of this technology.

As described hereinabove, the present subject matter solves many problems associated with previous strategies, systems and/or devices. However, it will be appreciated that various changes in the details, materials and arrangements of components, which have been herein described and illustrated in order to explain the nature of the present subject matter, may be made by those skilled in the art without departing from the principle and scopes of the claimed subject matter, as expressed in the appended claims.

What is claimed is:

1. A conductive trace comprising:
an interface layer bonded to a substrate,
a conductive layer on the interface layer,
a redox control layer covering the conductive layer; and
a metal layer in electrical contact with the conductive layer through one or more voids in the redox control layer,
wherein the interface layer and the redox control layer prevent the conductive layer from being exposed to the atmosphere.

2. The conductive trace according to claim 1, wherein the conductive layer comprises a metal selected from the group consisting of copper, aluminum, nickel, tin, tungsten, zinc, iron, silver, steel, and combinations thereof.

3. The conductive trace according to claim 1, wherein:
if the substrate comprises glass or ceramic, then the interface layer comprises a glass frit,
if the substrate comprises metal, then the interface layer comprises a dielectric material, and
if the substrate comprises polymer, then the interface layer comprises a silane based adhesion promoter.

4. The conductive trace according to claim 1, wherein the substrate comprises glass or ceramic, and the interface layer comprises borosilicate glass frit.

5. The conductive trace according to claim 1, wherein:
the interface layer includes one or more expansion modifiers having a thermal expansion coefficient between that of the conductive layer and that of the substrate, and
the expansion modifier is selected from the group consisting of cordierite, beta eucryptite, quartz, zirconia, alumina, spinels, metal, zinc silicates, magnesium silicates, barium silicates, strontium silicates, barium aluminum silicates, strontium aluminum silicates, lithium alumino silicates, zirconium silicates, barium magnesium silicates, barium titanium silicates, silica, titania and combinations thereof.

6. The conductive trace according to claim 1, wherein the interface layer includes a silver migration control additive selected from the group consisting of silicon, iron, zinc, glass frits containing sulfur, and combinations thereof.

7. The conductive trace according to claim 1, wherein the interface layer includes a dielectric material selected from the group consisting of borosilicate glass frits, silica, zirconia, alumina, titania based compounds, and a combination thereof.

8. The conductive trace according to claim 1, wherein the metal layer is a precious metal layer, wherein the precious metal layer includes one selected from the group consisting of silver, gold, platinum, titanium, rhodium, palladium, osmium, iridium, rhenium, ruthenium, germanium, beryllium, gallium, indium, tellurium, mercury, bismuth, and combinations thereof.

9. The conductive trace according to claim 8, further comprising a dielectric layer over the precious metal layer, the dielectric layer including one selected from the group consisting of porcelain, glass, polymers, and combinations thereof.

10. The conductive trace according to claim 9, wherein:
the interface layer is present up to about 10% by volume,
the conductive layer is present from about 40 to about 90% by volume,
the redox control layer is present up to about 20% by volume,
the precious metal layer is present up to about 15% by volume, and
the dielectric layer is present up to about 15% by volume.

11. The conductive trace according to claim 1, wherein one or more layers of the conductive trace includes an inorganic pigment selected from the group consisting of CuCr, CuCrMn, FeCrCo, $TiO_2$, NiCrFe, FeCo, FeMn and combinations thereof.

12. A method of forming a conductive trace on a substrate comprising:
bonding an interface layer to a surface of a substrate, the interface layer being formed from an interface material,
forming a conductive layer from a conductive material on the interface layer, wherein the conductive layer has an exposed portion,
layering a redox control material on the conductive layer to thereby form a redox control layer covering the exposed portion of the conductive layer,
producing a metal layer in electrical contact with the conductive layer through one or more voids in the redox control layer, and
wherein the interface layer and the redox control layer prevent the conductive layer from being exposed to oxygen present in the environment.

13. The method according to claim 12, wherein:
the substrate comprises one of i) glass or ceramic, ii) metal, or iii) polymer; and
if the substrate comprises i) glass or ceramic, then the interface material comprises borosilicate glass frit, if the substrate comprises ii) metal, then the interface material comprises a dielectric agent, and if the substrate comprises iii) polymer, then the interface material comprises a silane based adhesion promoter.

14. The method according to claim 12, wherein the interface material comprises a silver migration control additive selected from the group consisting of silicon, iron, zinc, glass frits containing sulfur, and combinations thereof.

15. The method according to claim 12, wherein the interface material comprises a dielectric material selected from the group consisting of borosilicate glass frit, silica, zirconia, alumina, titania based compounds, and combinations thereof.

16. The method according to claim 12, wherein the conductive material comprises a conductive metal powder selected from the group consisting of copper, aluminum, nickel, tin, tungsten, zinc, iron, silver, steel, and combinations thereof.

17. The method according to claim 12, wherein the redox control material comprises a redox control agent selected from the group consisting of carbon particles, oxygen getter material, and combinations thereof.

18. The method according to claim 12, wherein the metal layer is a precious metal layer formed from a precious metal material including one selected from the group consisting of silver, gold, platinum, titanium, rhodium, palladium, osmium, iridium, rhenium, ruthenium, germanium, beryllium, gallium, indium, tellurium, mercury, bismuth, and combinations thereof.

19. The method according to claim 18, further comprising generating a dielectric layer over the precious metal layer, wherein the dielectric layer is formed from a dielectric material comprising a dielectric agent selected from the group consisting of borosilicate glass frits, silica, zirconia, alumina, titania based compounds, and combinations thereof.

* * * * *